United States Patent
Giuliano

(10) Patent No.: US 9,818,733 B2
(45) Date of Patent: Nov. 14, 2017

(54) POWER CONVERTERS HAVING CAPACITIVE ENERGY TRANSFER ELEMENTS AND ARRANGEMENTS OF ENERGY STORAGE ELEMENTS FOR POWER CONVERTERS

(75) Inventor: David Michael Giuliano, Rochester, NY (US)

(73) Assignee: Massachusetts Institute of Technology, Cambridge, MA (US)

( * ) Notice: Subject to any disclaimer, the term of this patent is extended or adjusted under 35 U.S.C. 154(b) by 307 days.

(21) Appl. No.: 14/129,361

(22) PCT Filed: May 24, 2012

(86) PCT No.: PCT/US2012/039313
§ 371 (c)(1),
(2), (4) Date: Aug. 26, 2014

(87) PCT Pub. No.: WO2013/002924
PCT Pub. Date: Jan. 3, 2013

(65) Prior Publication Data
US 2014/0369018 A1   Dec. 18, 2014

Related U.S. Application Data

(60) Provisional application No. 61/501,303, filed on Jun. 27, 2011.

(51) Int. Cl.
*H05K 7/00* (2006.01)
*H01L 25/18* (2006.01)
(Continued)

(52) U.S. Cl.
CPC ............. *H01L 25/18* (2013.01); *H01L 23/642* (2013.01); *H02M 3/28* (2013.01); *H01L 24/48* (2013.01);
(Continued)

(58) Field of Classification Search
CPC ....... H01L 2924/30107; H01L 2924/00; H01L 2224/16225; H01L 2224/16227;
(Continued)

(56) References Cited

U.S. PATENT DOCUMENTS 6,107,860 A * 8/2000 Vinciarelli ........... H03K 17/691
327/109
6,396,137 B1   5/2002 Klughart
(Continued)

OTHER PUBLICATIONS

International Search Report, PCT/US2012/039313, dated Dec. 26, 2012, 3 pgs.

*Primary Examiner* — Yuriy Semenenko
(74) *Attorney, Agent, or Firm* — Burns & Levinson, LLP; Steven M. Mills

(57) ABSTRACT

A power converter includes a PCB and a semiconductor die coupled to the PCB. The semiconductor die includes first through fourth switching devices. The power converter further includes a first energy storage element electrically connected to the first and second switching devices and a second energy storage element electrically connected to the third and fourth switching devices. The first energy storage element is mounted over the first and second switching devices and the second energy storage element is mounted over the third and fourth switching devices.

25 Claims, 3 Drawing Sheets

(51) Int. Cl.
  *H01L 23/64* (2006.01)
  *H02M 3/28* (2006.01)
  *H01L 23/00* (2006.01)
  *H02M 7/00* (2006.01)

(52) U.S. Cl.
  CPC ............... *H01L 2224/16225* (2013.01); *H01L 2224/16227* (2013.01); *H01L 2224/48247* (2013.01); *H01L 2924/00014* (2013.01); *H01L 2924/1306* (2013.01); *H01L 2924/15311* (2013.01); *H01L 2924/181* (2013.01); *H01L 2924/19041* (2013.01); *H01L 2924/19106* (2013.01); *H01L 2924/30107* (2013.01); *H02M 7/003* (2013.01)

(58) Field of Classification Search
  CPC ......... H01L 2224/48247; H01L 23/642; H01L 24/48; H01L 25/18; H01L 2924/1306; H01L 2924/15311; H01L 2924/19041; H01L 2924/19106

USPC .......................................... 361/783, 811, 760
  See application file for complete search history.

(56) References Cited

U.S. PATENT DOCUMENTS

| | | | |
|---|---|---|---|
| 6,542,001 | B1 | 4/2003 | Yu |
| 7,327,581 | B2* | 2/2008 | Ohmori .................... G02B 6/43 257/675 |
| 9,041,183 | B2* | 5/2015 | Liang .................... H01L 25/072 257/691 |
| 2005/0213267 | A1* | 9/2005 | Azrai ...................... H02M 3/07 361/15 |
| 2009/0278262 | A1* | 11/2009 | Tan ................... H01L 23/49816 257/777 |
| 2014/0104790 | A1* | 4/2014 | Yoon ..................... H05K 7/209 361/716 |

\* cited by examiner

POWER CONVERTERS HAVING CAPACITIVE ENERGY TRANSFER ELEMENTS AND ARRANGEMENTS OF ENERGY STORAGE ELEMENTS FOR POWER CONVERTERS

RELATED APPLICATIONS

This application is the U.S. National Stage of International Application No. PCT/US2012/039313, filed on May 24, 2012, published in English, which claims priority to U.S. Provisional Application 61/501,303, filed Jun. 24, 2011. The entire contents of the above applications are incorporated herein by reference.

TECHNICAL FIELD

The present inventive concepts generally relate to power converters, and more particularly, to power converters having capacitive energy transfer elements and arrangements of capacitive energy storage elements for power converters.

BACKGROUND

Power converters generally comprise a plurality of switches and one or more capacitors, and can be used, for example to power portable electronic devices. Switch-mode power converters are a specific type of power converters that regulate the output voltage or current by switching storage elements (i.e. inductors and capacitors) into different electrical configurations. Switched capacitor converters are a subset of switch-mode power converters that typically utilize a large number of switches and capacitors to achieve a large voltage transformation ratio. However, the location of switches within a power converter package and the arrangement of capacitors outside of the package can lead to undesirable parasitic inductance and resistance, which can limit the performance of the power converter.

SUMMARY

In one aspect, a power converter comprises: a printed circuit board (PCB); a semiconductor die coupled to the PCB, the semiconductor die including first through fourth switching devices; a first energy storage element electrically connected to the first and second switching devices; and a second energy storage element electrically connected to the third and fourth switching devices, wherein the first energy storage element is mounted over the first and second switching devices and the second energy storage element is mounted over the third and fourth switching devices.

In some embodiments, the first switching device includes a first transistor, the second switching device includes a second transistor, the third switching device includes a third transistor, and the fourth switching device includes a fourth transistor.

In some embodiments, at least one of the first and second energy storage elements includes a capacitive element.

In some embodiments, the capacitive element includes a first capacitor and a second capacitor.

In some embodiments, the capacitive element includes at least one multilayer ceramic capacitor.

In some embodiments, the power converter further comprises an interconnect structure that electrically connects the first energy storage element and the second energy storage element to the first and second switching devices and the third and fourth switching devices.

In some embodiments, the interconnect structure includes at least one solder ball.

In some embodiments, the first energy storage element is electrically connected to the first and second switching devices via a first interconnect of the interconnect structure.

In some embodiments, the second energy storage element is electrically connected to the third and fourth switching devices via a second interconnect of the interconnect structure.

In some embodiments, the first energy storage element and the second energy storage element are mounted over a top planar surface of the semiconductor die.

In some embodiments, the first energy storage element is mounted over the first and second switching devices at a first distance and the second energy storage element is mounted over the third and fourth switching devices at a second distance.

In some embodiments, the first distance and the second distance are substantially uniform.

In some embodiments, the first through fourth switching devices are spaced apart on the semiconductor die.

In some embodiments, the power converter further comprises control circuitry, the control circuitry provided between the first through fourth switching devices.

In some embodiments, the first energy storage element overlaps the first and second switching devices.

In some embodiments, the second energy storage element overlaps the third and fourth switching devices.

In another aspect, an arrangement of energy storage elements comprises: a semiconductor die including a plurality of switching devices, the switching devices configured as switch-mode power converter; at least one energy storage element electrically connected to one or more of the switching devices, wherein the at least one energy storage element is mounted over a top planner surface of the semiconductor die.

In some embodiments, the at least one energy storage element includes first through third energy storage elements.

In some embodiments, the plurality of switching devices includes first through third sets of switching devices.

In some embodiments, the first energy storage element is electrically connected to the first set of switching devices, the second energy storage element is electrically connected to the second set of switching devices, and the third energy storage element is electrically connected to the third set of switching devices.

In some embodiments, the first through third energy storage elements are mounted at a same distance over the first through third sets of switching devices.

BRIEF DESCRIPTION OF THE DRAWINGS

The foregoing and other objects, features and advantages of embodiments of the present inventive concepts will be apparent from the more particular description of preferred embodiments, as illustrated in the accompanying drawings in which like reference characters refer to the same elements throughout the different views. The drawings are not necessarily to scale, emphasis instead being placed upon illustrating the principles of the preferred embodiments.

DETAILED DESCRIPTION OF EMBODIMENTS

Figure 1A:
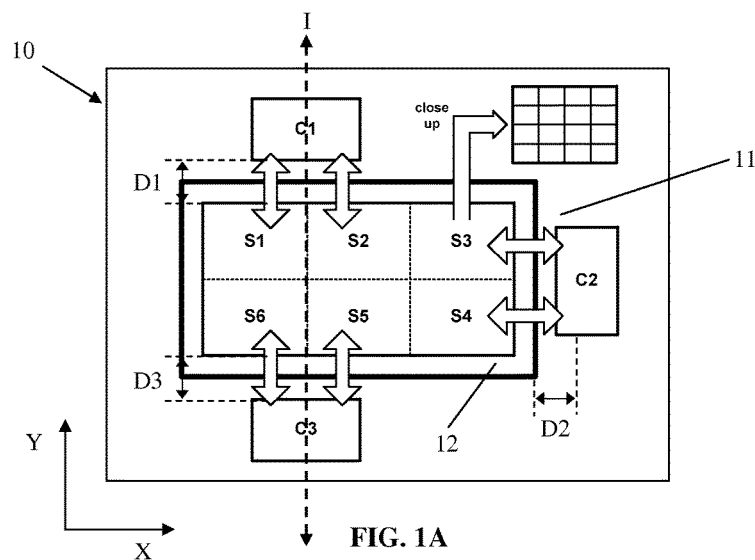
FIG. 1(a) is an aerial view of a power converter having switches and energy storage elements configured in a horizontal arrangement.

The terminology used herein is for the purpose of describing particular embodiments and is not intended to be limiting of the inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various limitations, elements, components, regions, layers and/or sections, these limitations, elements, components, regions, layers and/or sections should not be limited by these terms. These terms are only used to distinguish one limitation, element, component, region, layer or section from another limitation, element, component, region, layer or section. Thus, a first limitation, element, component, region, layer or section discussed below could be termed a second limitation, element, component, region, layer or section without departing from the teachings of the present application.

It will be further understood that when an element is referred to as being "on" or "connected" or "coupled" to another element, it can be directly on or above, or connected or coupled to, the other element, or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

Embodiments of the present application are directed in part to horizontal and vertical arrangements/orientations of energy storage elements (e.g., capacitors) in power converters and/or sub cells of power converters that utilize energy storage elements to transfer energy.

Power converters, such as switched capacitor power converters, can comprise a plurality of switches and one or more energy storage elements. These types of power converters can be used, for example, to power portable and non-portable electronic devices. Typically, a number of switches and capacitors are utilized in switched capacitor power converters to achieve a large voltage transformation ratio. The switches are usually implemented using field effect transistors (FETs) and the switch network can be integrated on a single or multiple semiconductor substrates. Furthermore, since each switch may carry a large amount of current, the switch may comprise a plurality of small switches connected in parallel.

FIG. 1 is an aerial view of a power converter having switches and energy storage elements configured in a horizontal arrangement. The power converter 10 may include a plurality of switches S and a plurality of capacitors C. The switches are labeled with the prefix 'S' and the capacitors are labeled with the prefix 'C'. In this example there are six switches (first through sixth switches S1-S6) and three capacitors (first through third capacitors C1-C3).

Figure 1B:
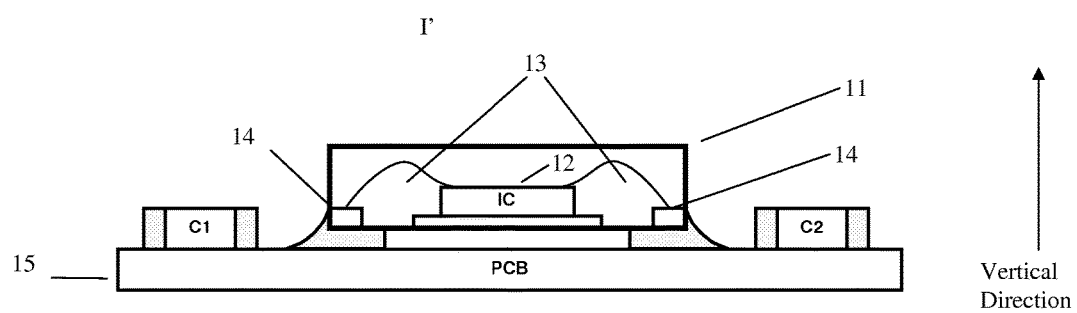
FIG. 1(b) is a cross-sectional view taken along line I-I' of a wire bond implementation of FIG. 1(a).

FIG. 1(b) is a cross-sectional view taken along line I-I' of FIG. 1(a). In power converters 10 of this type, it is common practice to wire bond 13 the switches S1-S6 of an integrated circuit (IC) 12 or semiconductor die to a lead frame 14 within a package 11, and then horizontally mount the capacitors C1-C3 outside the package 11. For example, the capacitors C1-C3 may be mounted on a printed circuit board (PCB) next to the package 12.

The switches S1-S6 may be provided on a single IC 12 or semiconductor die, or may be provided on multiple ICs 12 or semiconductor dies. The capacitors C1-C3 may be horizontally disposed with respect to the package 11 and coupled to the package 11 via traces of the PCB.

Unfortunately in this horizontal arrangement of capacitors C1-C3, there can be a sufficient distance D1, D2, D3 between the capacitors C1-C3 and switches S1-S6 that can introduce a large and undesirable parasitic inductance and resistance, which can limit the performance of the power converter 10. Furthermore, the distances D1, D2, D3 may be unequal, which can add a non-uniform inductance and resistance between the sets of switched S1-S6 (e.g., S1/S2, S3/S4, S5/S6).

Figure 1C:
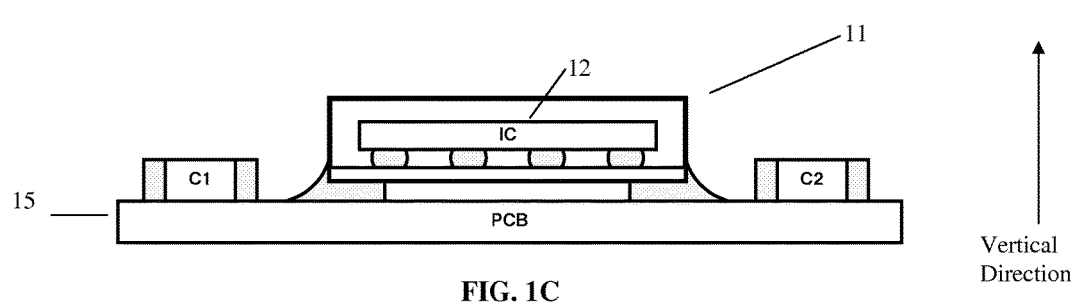
FIG. 1(c) is a cross-sectional view taken along line I-I' of a flip chip implementation of FIG. 1(a).

FIG. 1(c) is a cross-sectional view taken along line I-I' of FIG. 1(a). In power converters 10 of this type, it is common practice to mount the switches S1-S6 of an integrated circuit (IC) 12 or semiconductor die to pads of a package 11, and then horizontally mount the capacitors C1-C3 outside the package 11. However, for reasons similar to those described above with regard to FIG. 1(b), there can be a sufficient distance D1, D2, D3 between the capacitors C1-C3 and switches S1-S6 that can introduce a large and undesirable parasitic inductance and resistance, which can limit the performance of the power converter 10. Furthermore, the distances D1, D2, D3 may be unequal, which can add a non-uniform inductance and resistance between the sets of switched S1-S6 (e.g., S1/S2, S3/S4, S5/S6).

Figure 2:
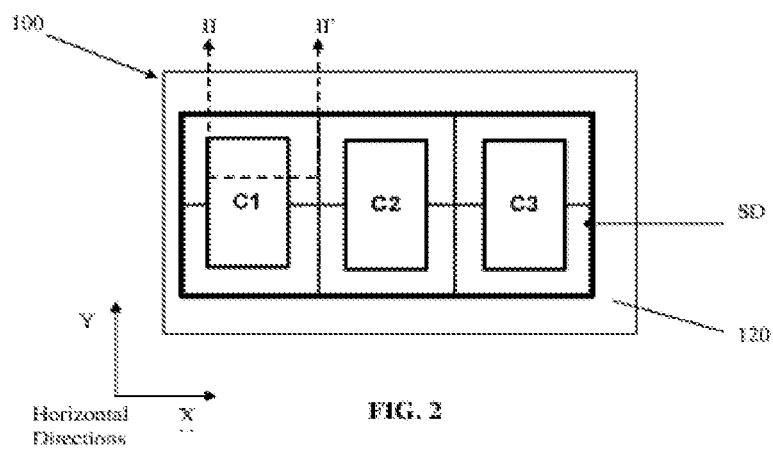
FIG. 2 is a block diagram illustrating a power converter having switches and energy storage elements configured in a vertical arrangement, in accordance with embodiments of the present inventive concepts.

FIG. 2 is a block diagram illustrating a power converter having switches and energy storage elements configured in a vertical arrangement, in accordance with embodiments of the present inventive concepts. The power converter 100 may include a plurality of switches S and one or more energy storage elements C (e.g., capacitors). In the exemplary embodiment shown in FIG. 2, the power converter 100 includes six switches (first through sixth switches S1-S6) and three energy storing elements (first through third energy storing elements C1-C3); however, the power converter 100 is not limited in number of switches S and energy storage elements C.

The energy storage elements C1-C3 may be vertically mounted over or below the switches S1-S6. The energy storage elements C1-C3 may be electrically coupled to the switches S1-S6 via an interconnect structure (see for example, interconnect I shown in FIGS. 4 and 5). For example, the switches S1-S6 may be provided on a semiconductor die SD or integrated circuit, which may be mounted (e.g., soldered) to one side of a PCB 120 while the capacitors C1-C3 may be mounted (e.g., soldered) to the other side of the PCB 120 and electrically connected via the interconnect structure I and/or traces on the PCB 120.

The energy storage elements C1-C3 are arranged in a vertical fashion with respect to the semiconductor die SD or integrated circuit so as to fit above or below the switches S1-S6. The shape and location of the switches S1-S6 on the semiconductor die SD can be chosen to fit optimally below or above the energy storage elements C1-C3. Furthermore, the exact size of the switches S1-S6 need not be the same size as the energy storage elements C1-C3. Instead, the switches S1-S6 may be required to be below or above the energy storage elements C1-C3.

In this vertical arrangement of energy storage elements C1-C3, the distance D4 (see FIG. 4) between the switches S1-S6 and the energy storage elements C1-C3 can be reduced when compared to the conventional horizontal arrangement of capacitors shown in FIGS. 1(a)-(c), which can maximize the performance of the power converter 100. That is, the parasitic inductance and resistance can be reduced. In addition, the distance D4 between the switches S1-S6 and the capacitors C1-C3 can be substantially uniform, which can normalize the parasitic inductance and resistance between the sets of switches S1-S6 (e.g., S1/S2, S3/S4, and S5/S6).

Figure 3:
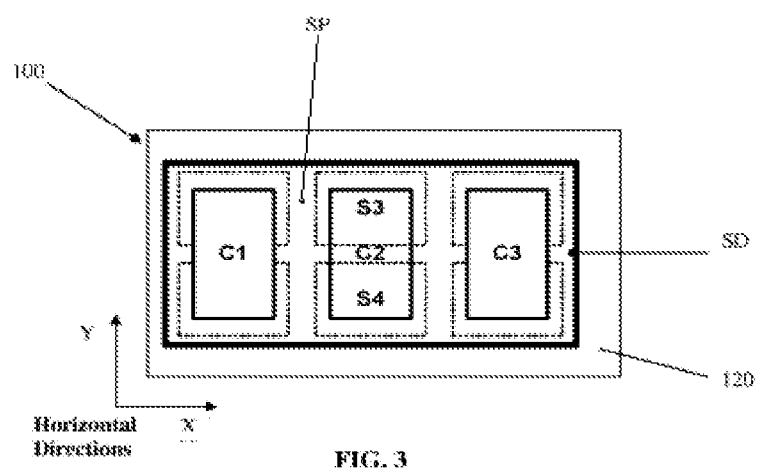
FIG. 3 is a block diagram illustrating a power converter having switches and energy storage elements configured in a vertical arrangement, in accordance with other embodiments of the present inventive concepts.

FIG. 3 is a block diagram illustrating a power converter having switches and energy storage elements configured in a vertical arrangement, in accordance with other embodiments of the present inventive concepts. Similar to the power converter shown in FIG. 2, the power converter 100 shown in FIG. 3 may include a plurality of switches S and one or more energy storage elements C (e.g., capacitors); however, the power converter 100 of FIG. 3 is configured with a spare space SP between the switches S1-S6. The spare space SP on the semiconductor die SD can be used for providing control circuitry, gate driver circuitry, etc.

Figure 4:
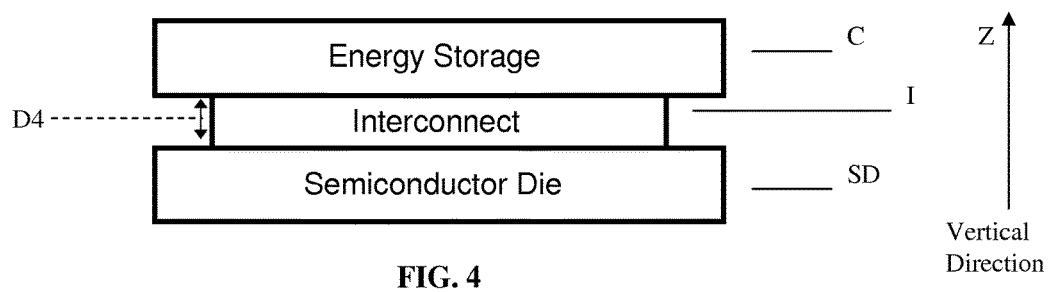
FIG. 4 is a cross-sectional view taken along line II-II' of FIG. 2, in accordance with embodiments of the present inventive concepts.

FIG. 4 is a cross-sectional view taken along line II-II' of FIG. 2, in accordance with embodiments of the present inventive concepts. As described above with regard to FIGS. 2 and 3, a power converter 100 may include a plurality of switches S and one or more energy storage elements C configured in a vertical arrangement.

The energy storage elements C may include discrete multilayer ceramic capacitors (MLCCs) or other types of capacitive storage elements. The switches on the semiconductor die SD may be connected to the energy storage elements C via an interconnect structure I. The interconnect structure I can be implemented in numerous ways, such as a high performance PCB substrate bumped to the die or simply the backend multilayer interconnect of the die itself. For example, the interconnect structure I may connect the switches S on the semiconductor die SD to the energy storage elements C in an areal fashion, such as a ball grid array.

Figure 5:
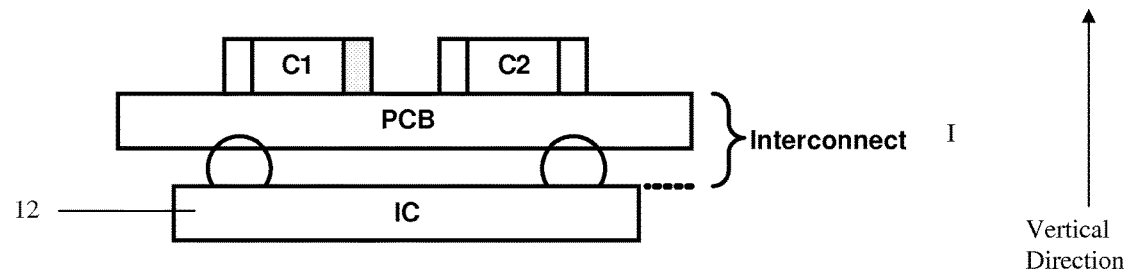
FIG. 5 is a cross-sectional view of a power converter having switches and energy storage elements configured in a vertical arrangement, in accordance with embodiments of the present inventive concepts.

FIG. 5 is a cross-sectional view of a power converter having switches and energy storage elements configured in a vertical arrangement, in accordance with embodiments of the present inventive concepts. As described above with regard to FIGS. 2 and 3, a power converter 100 may include a plurality of switches S formed on an IC 12 or semiconductor die and one or more energy storage elements C1, C2 electrically coupled to the IC 12.

The energy storage elements C1, C2 may be electrically coupled to the switches S formed on the IC 12 via an interconnect structure I. For example, the interconnect structure I may include a PCB having a ball grid array formed on a first side of the PCB that is constructed and arranged to mate with pads of the IC 12. Alternatively, the interconnect structure I may include a PCB having a plurality of pads formed on a first side of the PCB that are constructed and arranged to mate with a ball grid array of the IC 12. The energy storage elements C1, C2 may be mounted (e.g., soldered) to a second side of the PCB. In this manner, the distance or electrical path between the energy storage elements C1, C2 and the switches S formed on the IC 12 can be reduced when compared to the conventional horizontal arrangement of capacitors shown in FIGS. 1(a)-(c), which can maximize the performance of the power converter 100.

In summary, the vertical arrangement described above with respect to FIGS. 2-4 minimizes the distance between the switches on the semiconductor die and the capacitors, while also providing a uniform current distribution to each individual switch within the main switches. Thus the parasitic resistance and inductance of the connection between the switches and capacitors is minimized. This can be important because the parasitic inductance limits the speed at which the converter can operate, thus limiting its ultimate size, while the parasitic resistance limits the efficiency of the power conversion process. The vertical arrangement also gives the added benefit of a smaller overall footprint when compared to the conventional horizontal arrangement.

While the present inventive concepts have been particularly shown and described above with reference to exemplary embodiments thereof, it will be understood by those of ordinary skill in the art, that various changes in form and detail can be made without departing from the spirit and scope of the present inventive concepts described and defined by the following claims.

What is claimed is:

1. A power converter comprising:
a printed circuit board (PCB);
a semiconductor die coupled to the PCB, the semiconductor die including first through fourth switching devices;
a first energy storage element electrically connected to the first and second switching devices; and
a second energy storage element electrically connected to the third and fourth switching devices;
wherein the first energy storage element is vertically mounted over the first and second switching devices and the second energy storage element is vertically mounted over the third and fourth switching devices,
wherein the first through fourth switching devices are spaced apart from one another on the semiconductor die and wherein the semiconductor die further includes gate driver circuitry interspaced in a spare space between the switching devices.

2. The power converter of claim 1, wherein the first switching device includes a first transistor, the second switching device includes a second transistor, the third switching device includes a third transistor, and the fourth switching device includes a fourth transistor.

3. The power converter of claim 1, wherein at least one of the first and second energy storage elements includes a capacitive element.

4. The power converter of claim 3, wherein the capacitive element includes a first capacitor and a second capacitor.

5. The power converter of claim 3, wherein the capacitive element includes at least one multilayer ceramic capacitor.

6. The power converter of claim 1, further comprising an interconnected structure that electrically connects the first energy storage element and the second energy storage element to the first and second switching devices and the third and fourth switching devices.

7. The power converter of claim 6, wherein the interconnect structure includes at least one solder ball.

8. The power converter of claim 6, wherein the first energy storage element is electrically connected to the first and second switching devices via a first interconnect of the interconnect structure.

9. The power converter of claim 8, wherein the second energy storage element is electrically connected to the third and fourth switching devices via a second interconnect of the interconnect structure.

10. The power converter of claim 1, wherein the first energy storage element and the second energy storage element are mounted over a top planar surface of the semiconductor die.

11. The power converter of claim 1, wherein the first energy storage element is mounted over the first and second switching devices at a first distance and the second energy storage element is mounted over the third and fourth switching devices at a second distance.

12. The power converter of claim 11, wherein the first distance and the second distance are substantially uniform.

13. The power converter of claim 1, further comprising control circuitry, the control circuitry interspaced between the first through fourth switching devices.

14. The power converter of claim 1, wherein the first energy storage element overlaps the first and second switching devices.

15. The power converter of claim 14, wherein the second energy storage element overlaps the third and fourth switching devices.

16. The power converter of claim 1, wherein the first and second energy storage elements and the first, second, third and fourth switching devices are arranged so as to provide a uniform current distribution to each switching device.

17. The power converter of claim 1, wherein a first end of the first energy storage element is vertically mounted over the first switching device and a second end of the first energy storage element is vertically mounted over the second switching device and a first end of the second energy storage element is vertically mounted over the third switching device and a second end of the second energy storage element is vertically mounted over the fourth switching device.

18. The power converter of claim 1, wherein the first and second energy storage elements and the first, second, third and fourth switching devices are arranged so as to provide for same electrical path distances between the energy storage elements and the switching devices.

19. The power converter of claim 1, wherein the first and second energy storage elements and the first, second, third and fourth switching devices are arranged so as to provide uniform inductance and resistance between respective pairs of the switching devices.

20. The power converter of claim 1, wherein the first and second energy storage elements and the first, second, third and fourth switching devices are arranged so as to minimize inductance and resistance between respective pairs of the switching devices.

21. An arrangement of energy storage elements comprising:
a semiconductor die including a plurality of switching devices, the switching devices configured as switch-mode power converter;
at least one energy storage element electrically connected to one or more of the switching devices,
wherein the at least one energy storage element is vertically mounted over a top planner surface of the semiconductor die,
wherein the plurality of switching devices are spaced apart from one another on the semiconductor die and wherein the semiconductor die further includes gate driver circuitry interspaced in a spare space between the switching devices.

22. The arrangement of energy storage elements of claim 21, wherein the at least one energy storage element includes first through third energy storage elements.

23. The arrangement of energy storage elements of claim 22, wherein the plurality of switching devices includes first through third sets of switching devices.

24. The arrangement of energy storage elements of claim 23, wherein the first energy storage element is electrically connected to the first set of switching devices, the second energy storage element is electrically connected to the second set of switching devices, and the third energy storage element is electrically connected to the third set of switching devices.

25. The arrangement of energy storage elements of claim 24, wherein the first through third energy storage elements are mounted at a same distance over the first through third sets of switching devices.

* * * * *